(12) United States Patent
Wang et al.

(10) Patent No.: US 9,897,877 B2
(45) Date of Patent: Feb. 20, 2018

(54) THIN FILM TRANSISTOR ARRAY SUBSTRATE AND LIQUID CRYSTAL DISPLAY PANEL USING SAME

(71) Applicant: Century Technology (Shenzhen) Corporation Limited, Shenzhen (CN)

(72) Inventors: Ming-Tsung Wang, New Taipei (TW); Chih-Chung Liu, New Taipei (TW); Yi-Hsiu Cheng, New Taipei (TW); Jian-Xin Liu, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 65 days.

(21) Appl. No.: 15/013,713

(22) Filed: Feb. 2, 2016

(65) Prior Publication Data
US 2017/0082881 A1    Mar. 23, 2017

(30) Foreign Application Priority Data
Sep. 23, 2015    (CN) .......................... 2015 1 0610512

(51) Int. Cl.
*G02F 1/1362* (2006.01)
*H01L 27/12* (2006.01)
*G02F 1/1343* (2006.01)

(52) U.S. Cl.
CPC ...... *G02F 1/136213* (2013.01); *H01L 27/124* (2013.01); *H01L 27/1255* (2013.01); *G02F 2001/134318* (2013.01)

(58) Field of Classification Search
CPC .................................................... G02F 1/1368
See application file for complete search history.

(56) References Cited

U.S. PATENT DOCUMENTS

2011/0085121 A1    4/2011    Jeon et al.
2013/0107151 A1*   5/2013    Sasaki ............... G02F 1/134363
                                                    349/38

FOREIGN PATENT DOCUMENTS

CN    102033365 A    4/2011
CN    104280951 A    1/2015

* cited by examiner

*Primary Examiner* — Edmond Lau
(74) *Attorney, Agent, or Firm* — ScienBiziP, P.C.

(57) ABSTRACT

A thin film transistor array substrate includes a base, a first metal layer having a gate electrode and a first insulating layer covering the base and the first metal layer. A semiconductor layer is formed on the first insulating layer facing but insulated from the gate electrode. The first insulating layer also supports a second metal layer having a source electrode and a drain electrode. A pixel electrode layer is electrically coupled to the source electrode or the drain electrode. A common electrode layer is insulated from the pixel electrode and is configured to receive a common voltage. A transparent conductive layer is formed on the base and is insulated from the pixel electrode. The semiconductor layer, electrically coupled to the source electrode and the drain electrode, is located between the source electrode and the drain electrode.

20 Claims, 10 Drawing Sheets

THIN FILM TRANSISTOR ARRAY SUBSTRATE AND LIQUID CRYSTAL DISPLAY PANEL USING SAME

FIELD

The subject matter herein generally relates to a thin film transistor array substrate and a liquid crystal display panel using the thin film transistor array substrate.

BACKGROUND

Liquid crystal display panels are widely used in electronic devices, such as mobile phones, panel computers, and televisions. A liquid crystal display panel usually includes a thin film transistor array substrate.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

Figure 1:
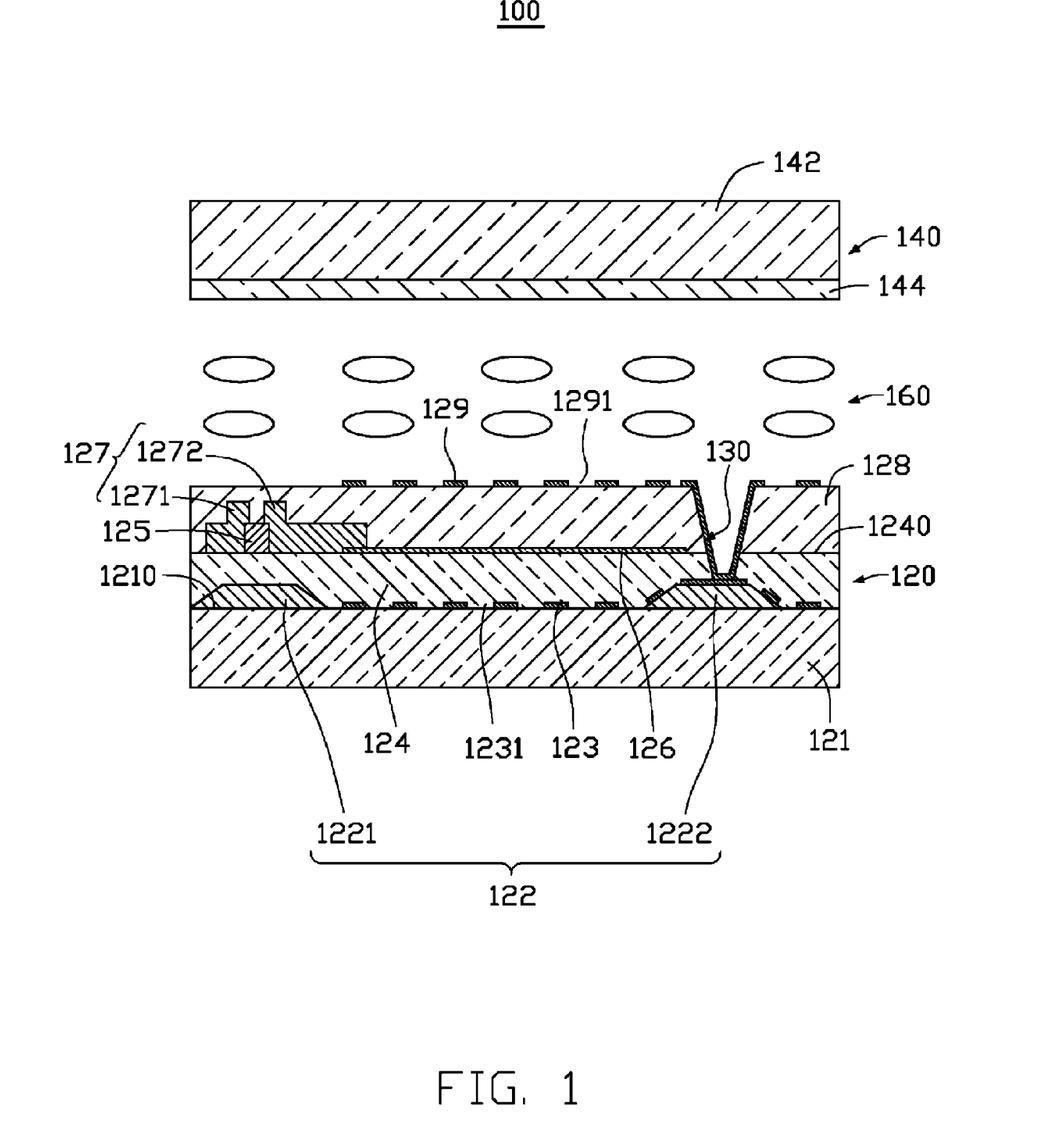
FIG. 1 is a cross-sectional view of a first exemplary embodiment of a liquid crystal display (LCD) panel.

FIG. 1 illustrates an LCD panel 100 according to a first exemplary embodiment. The LCD panel 100 includes a TFT array substrate 120, an opposite substrate 140 facing the TFT array substrate 120, and a liquid crystal layer 160 located between the TFT array substrate 120 and the opposite substrate 140. The opposite substrate 140 may be a color filter. The opposite substrate 140 includes a base layer 142 and a color filter layer 144 formed on the base layer 142 and facing the liquid crystal layer 160.

The TFT array substrate 120 includes a base 121, a first metal layer 122 and a transparent conductive layer 123 formed on the base 121, a first insulating layer 124 formed on and covering the base 121, the first metal layer 122, and the transparent conductive layer 123. The TFT array substrate 120 further includes a semiconductor layer 125, a pixel electrode layer 126, and a second metal layer 127 formed on the first insulating layer 124. The TFT array substrate 120 further includes a second insulating layer 128 formed on and covering the first insulating layer 124, the semiconductor layer 125, the pixel electrode layer 126, and the second metal layer 127. The TFT array substrate 120 further includes a common electrode layer 129 formed on the second insulating layer 128. The first metal layer 122 partially covers a surface 1210 of the base 121 facing the common electrode layer 129. The second metal layer 127, the semiconductor layer 125, and the pixel electrode layer 126 partially cover a surface 1240 of the first insulating layer 124, wherein the surface 1240 faces the common electrode layer 129. The TFT array substrate 120 defines a hole 130 through the second insulating layer 128 and the first insulating layer 124.

The first metal layer 122 and the second metal layer 127 are made of a conductive metal material of a type or types known in the field. The transparent conductive layer 123 is made of a transparent conductive material of a type or types known in the field. The semiconductor layer 125 is made of a semiconductor material of a type or types known in the field. The pixel electrode layer 126 and the common electrode layer 129 are made of a conductive metal material of a type or types also known in the field.

In at least one embodiment, the first metal layer 122 comprises a gate electrode 1221 and a storage capacitor 1222. At least a portion of the transparent conductive layer 123 partially covers the storage capacitor 1222 and is electrically connected to the storage capacitor 1222. Other portion of the transparent conductive layer 123 is formed on and partially covers the surface 1210 of the base 121 but excluding the first metal layer 122. The first insulating layer 124 covers the first metal layer 122, the transparent conductive layer 123, and the surface 1210 of the base 121 which is not covered by the first metal layer 122 and the transparent conductive layer 123. The semiconductor layer 125 faces the gate electrode 1221. The first insulating layer 124 is interposed between the semiconductor layer 125 and the gate electrode 1221. In other words, the semiconductor layer 125 is insulated from the gate electrode 1221.

The second insulating layer 128 covers the semiconductor layer 125, the pixel electrode layer 126, the second metal layer 127, and the surface 1240 of the first insulating layer 124 which is not covered by the semiconductor layer 125, by the pixel electrode layer 126, and by the second metal layer 127. The second metal layer 127 comprises a source electrode 1271 and a drain electrode 1272. The source electrode 1271 and the drain electrode 1272 are coupled to opposite ends of the semiconductor layer 125, thus a thin film transistor is defined by the source electrode 1271, the drain electrode 1272, the semiconductor layer 125, and the gate electrode 1221. The pixel electrode layer 126 is electrically coupled to either the source electrode 1271 or the drain electrode 1272, and as such the thin film transistor is able to receive a display driving signal. In at least one embodiment, the pixel electrode layer 126 is electrically coupled to the drain electrode 1272. The second insulating layer 128 is interposed between the common electrode layer 129 and the pixel electrode layer 126. In other words, the common electrode layer 129 is insulated from the pixel electrode layer 126. The common electrode layer 129 can be configured to receive a common voltage and cooperate with the pixel electrode layer 126 to realize the display. The common electrode layer 129 passes through the hole 130 and is electrically coupled to the transparent conductive layer 123.

The common electrode layer 129 and the pixel electrode layer 126 are configured to form a planar electric field for driving liquid crystal molecules in the liquid crystal layer 160 to rotate in a plane. The common electrode layer 129 defines a plurality of gaps 1291 through which the second insulating layer 128 is exposed. The transparent conductive layer 123 and the common electrode layer 129 have a same pattern structure and are located at different layers of the TFT array substrate 120. In other words, the transparent conductive layer 123 also defines a plurality of gaps 1231 exposing the first insulating layer 124 therethrough. The transparent conductive layer 123 is insulated from the pixel electrode layer 126. The transparent conductive layer 123 can be used as an auxiliary storage capacitor and cooperates with the storage capacitor 1222. As the common electrode layer 129 is electrically coupled to the transparent conductive layer 123, the transparent conductive layer 123 also receives a common voltage when a common voltage is applied to the common electrode layer 129.

Figure 2:
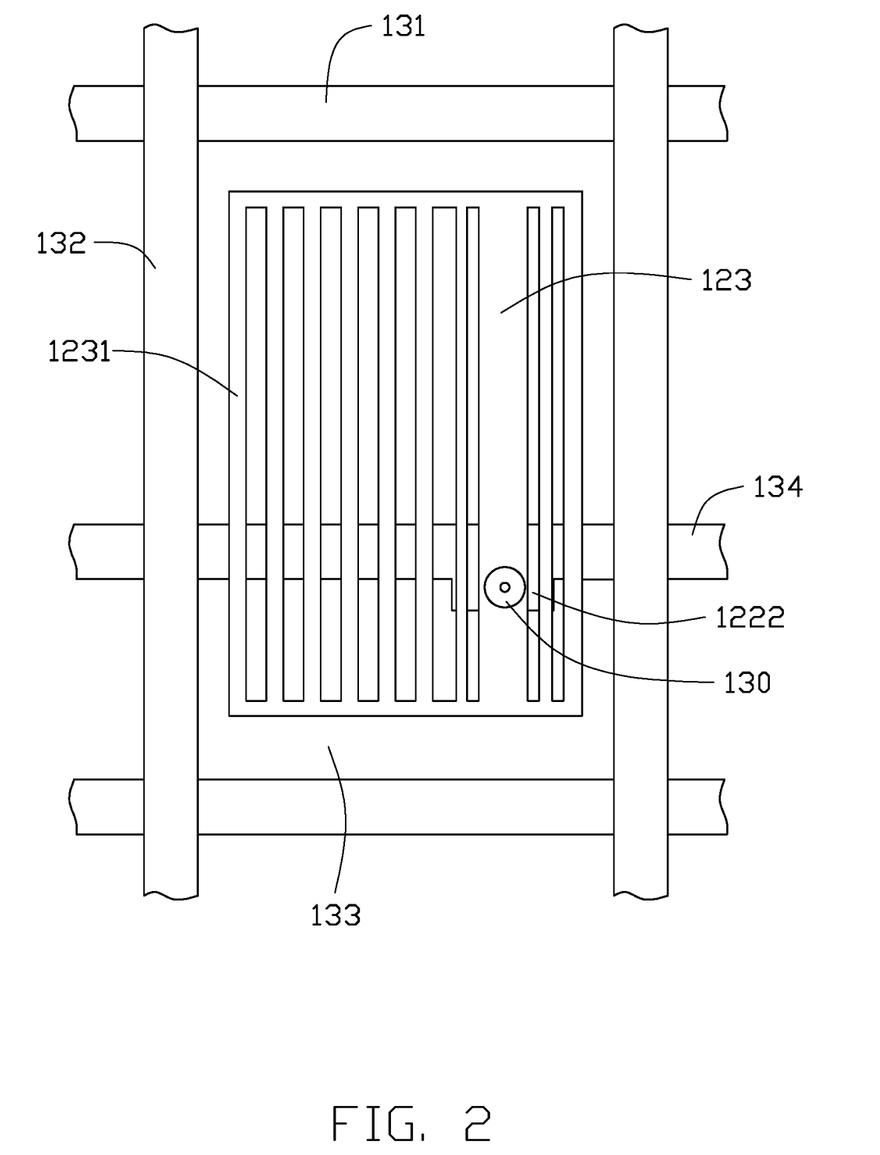
FIG. 2 is a plan view of a first exemplary embodiment of a transparent conductive layer and storage capacitor in the LCD panel of FIG. 1.

FIG. 2 illustrates the transparent conductive layer 123 and the storage capacitor 1222 shown in FIG. 1. The TFT array substrate 120 further includes a plurality of gate lines 131, a plurality of source lines 132 insulated from the gate lines 131, and a plurality of storage capacitor lines 134. As is known in the field, the gate lines 131 are electrically coupled to the gate electrode 1221, the source lines 132 are electrically coupled to the source electrode 1271, and the storage capacitor line 134 is electrically coupled to the storage capacitor 1222. The gate lines 131 and the source lines 132 may intersect to define a plurality of pixels areas 133. The plurality of gaps 1231 are located in the pixel area 133. In at least one embodiment, the gate lines 131 extend along a first direction while the source lines 132 extend along a second direction perpendicular to the first direction. Thus, each pixel area 14 is rectangular. In at least one embodiment, each gap 1231 has a strip shape and the strip-shaped gaps 1231 are parallel.

Figure 3:
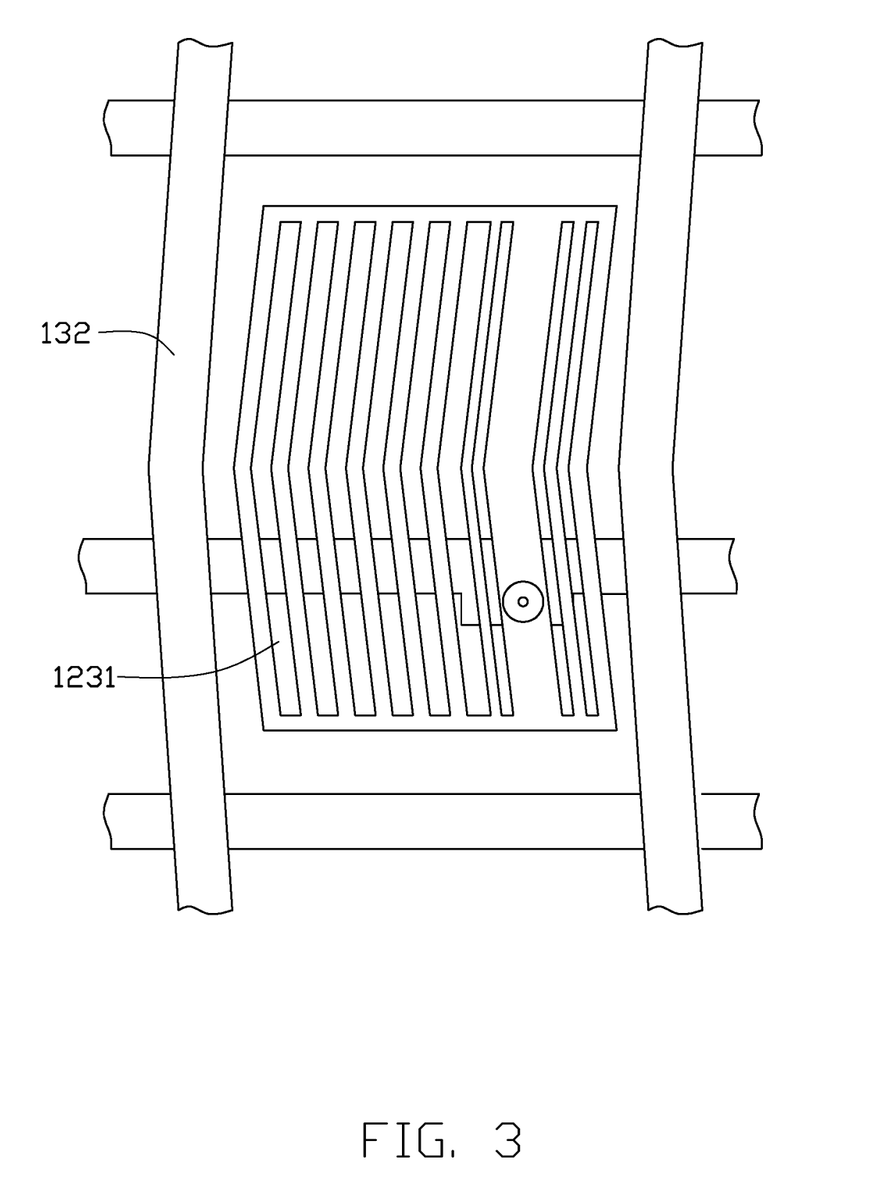
FIG. 3 is a plan view of a second exemplary embodiment of a transparent conductive layer and storage capacitor in the LCD panel of FIG. 1.

In other embodiment, the source line 132 may have a zigzagging shape and each gap 1231 may also have a zigzagging shape, as shown in FIG. 3.

The gate lines 131 may be a portion of the first metal layer 122. In other words, both the gate lines 131 and the gate electrode 1221 may be simultaneously formed on the base 121 in one process. The source line 132 may be a portion of the second metal layer 127. In other words, the source line 132, the source electrode 1271, and the drain electrode 1272 may be simultaneously formed on the first insulating layer 124 in one process. The storage capacitor line 134, the gate electrode 1221, and the gate lines 131 may be simultaneously formed on the base 121 in one process. In at least one embodiment, the storage capacitor line 134 is parallel to the gate lines 131. The storage capacitor lines 134 are configured to be electrically coupled to an outside driving circuit and apply a common voltage to the storage capacitor 1222. The storage capacitor 1222 may be a portion of the storage capacitor line 134, or the storage capacitor 1222 may extend from the storage capacitor line 134. In at least one embodiment, as shown in FIGS. 2 and 3, the storage capacitor 1222 extends from the storage capacitor line 134 and is electrically coupled to the storage capacitor line 134.

Figure 4:
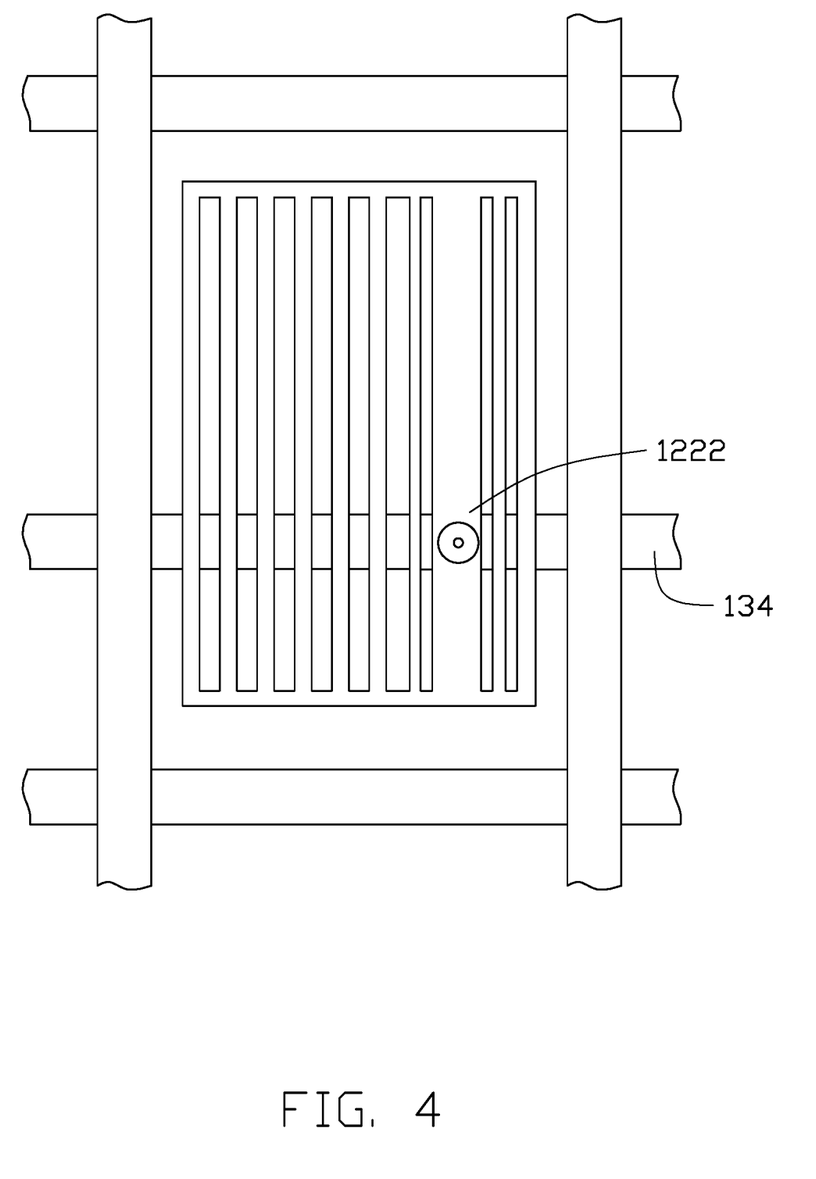
FIG. 4 is a plan view of a third exemplary embodiment of a transparent conductive layer and storage capacitor in the LCD panel of FIG. 1.

In other embodiments, the storage capacitor 1222 may be a portion of the storage capacitor line 134 as shown in FIG. 4.

Figure 5:
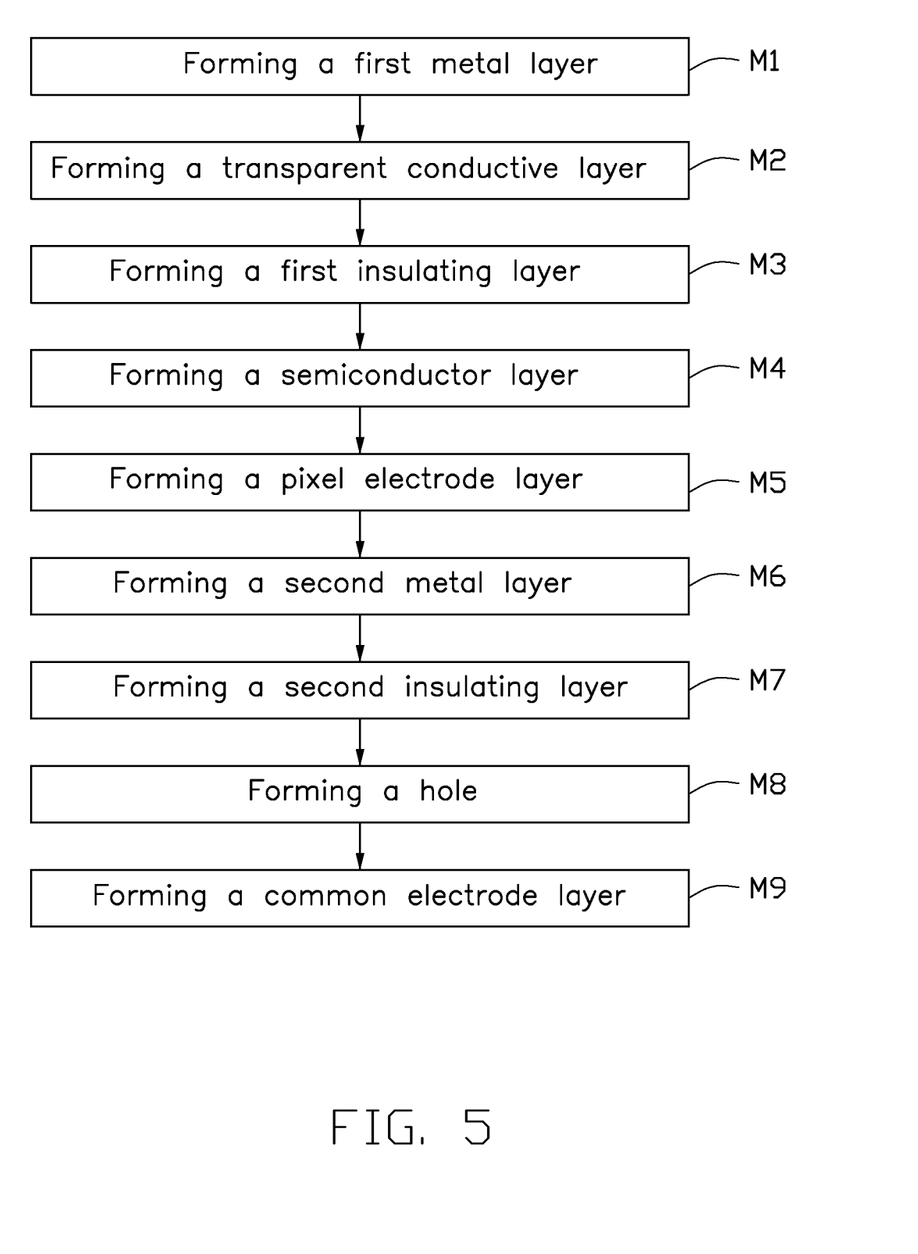
FIG. 5 is a flow chart of a method for making a thin film transistor (TFT) array substrate used in the LCD panel of FIG. 1.

FIG. 5 illustrates a flow chart of an example method for making a TFT array substrate shown in FIG. 1. The example method is provided by way of example, as there are a variety of ways to carry out the method. Each block shown in FIG. 5 represents one or more processes, methods or subroutines, carried out in the exemplary method. The exemplary method can begin at block M1.

At block M1, a first metal layer is formed on a base. In at least one embodiment, the process of forming a first metal layer may comprise applying a coating of metal materials on the base and patterning the metal materials by a photo etching process (PEP) using a first mask to form the first metal layer. The PEP generally comprises coating photoresist, exposure and developing the photoresist, etching, peeling photoresist, and on.

At block M2, a transparent conductive layer is formed on the first metal layer and the base. The process of forming a transparent conductive layer may include applying a coating of transparent conductive materials on the first metal layer and the base, and patterning the transparent conductive materials by PEP using a second mask to form the transparent conductive layer.

At block M3, a first insulating layer is formed the base, the transparent conductive layer, and the first metal layer.

At block M4, a semiconductor layer is formed on the first insulating layer. The process of forming a semiconductor layer may include applying a coating of semiconductor materials on the first insulating layer and patterning the semiconductor materials by PEP using a third mask to form the pixel electrode layer.

At block M5, a pixel electrode layer is formed on the first insulating layer. The process of forming a pixel electrode layer may include applying a coating of pixel electrode materials on the first insulating layer and patterning the pixel electrode materials by PEP using a fourth mask to form the pixel electrode layer.

At block M6, a second metal layer is formed on the first insulating layer. The process of forming a second metal layer may include applying a coating of metal materials on the first insulating layer and patterning such metal materials by PEP using a fifth mask to form the second metal layer.

At block M7, a second insulating layer is formed on the semiconductor layer, pixel electrode layer, the second metal layer, and the first insulating layer.

At block M8, a hole is defined in the first insulating layer and the second insulating layer.

At block M9, a common electrode layer is formed on the second insulating layer. The process of forming a common electrode layer may include applying a coating of common electrode materials on the second insulating layer and wall of the hole, and patterning the common electrode materials by PEP using a sixth mask to form the common electrode layer.

When the transparent conductive layer and the common electrode layer have a same pattern structure, the second mask used in the forming of the transparent conductive layer and the sixth mask used in the forming of the common electrode layer may be the same mask.

Figure 6:
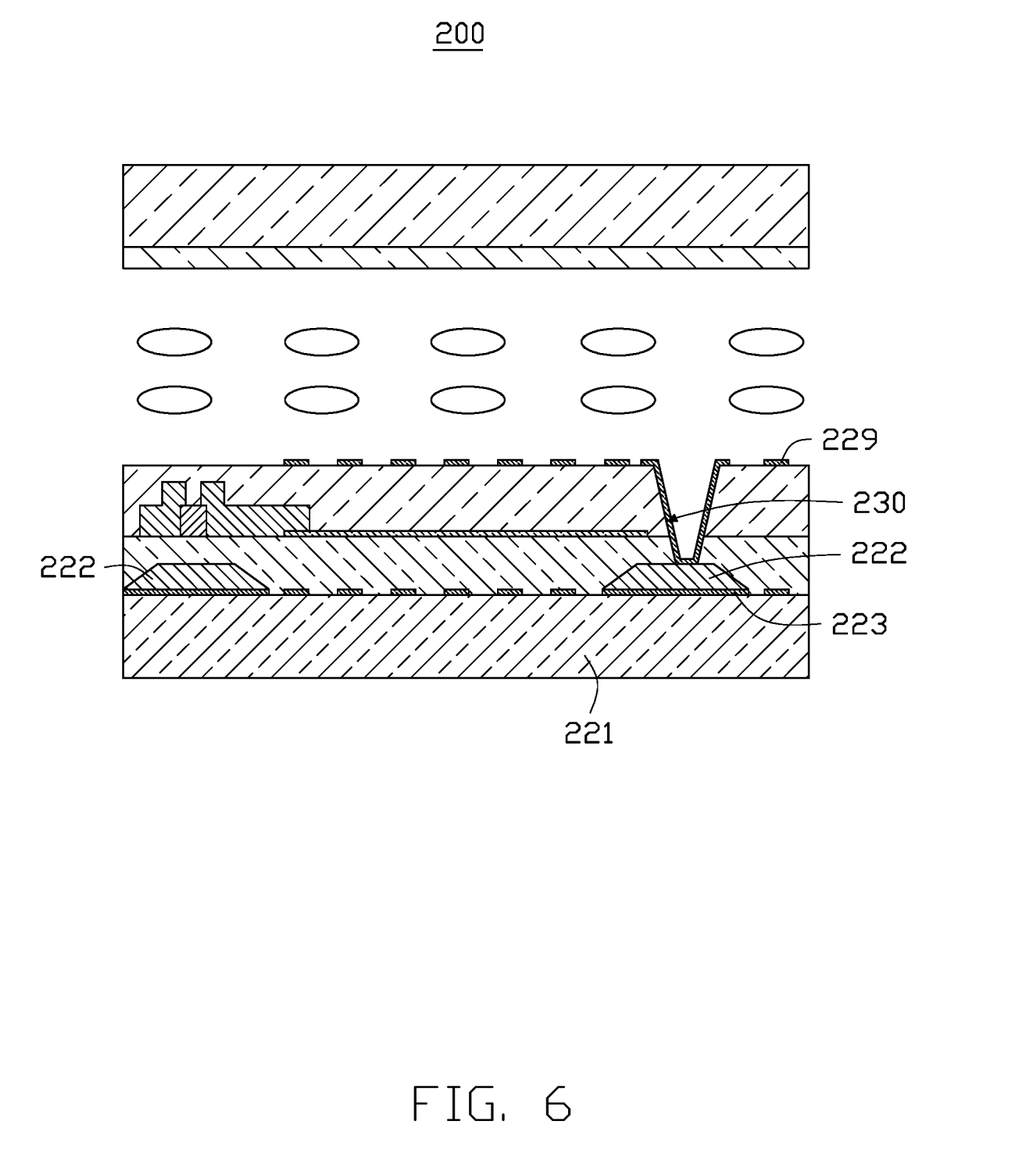
FIG. 6 is a cross-sectional view of a second exemplary embodiment of an LCD panel.

FIG. 6 illustrates an LCD panel 200 according to a second exemplary embodiment. The LCD panel 200 is substantially the same as the LCD panel 100 except that the transparent conductive layer 223 of the LCD panel 200 is directly formed on the base 221 and the first metal layer 222 is directly formed on the transparent conductive layer 223. The common electrode layer 229 passes through the hole 230 and is electrically coupled to the storage capacitor 2222.

Figure 7:
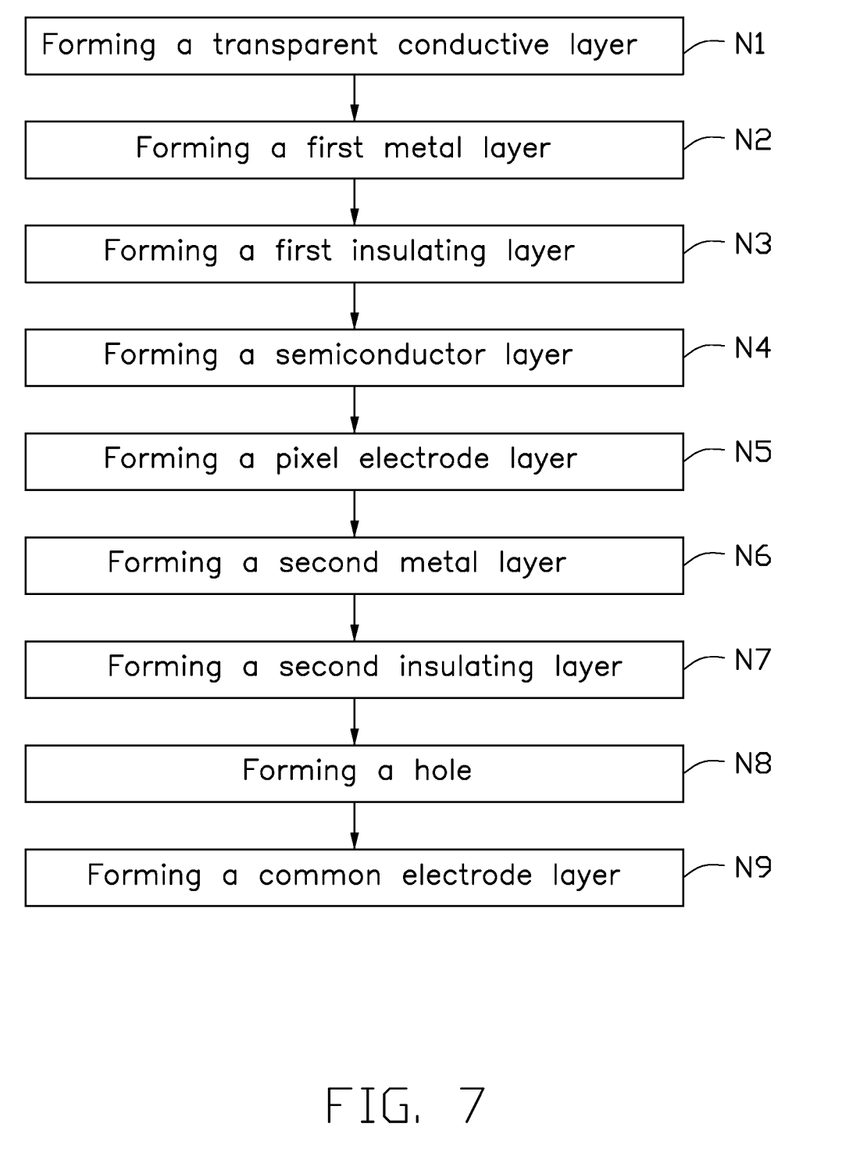
FIG. 7 is a flow chart of a method for making the TFT array substrate of FIG. 6.

FIG. 7 illustrates a flow chart of a method for making the TFT array substrate shown in FIG. 6. The example method is provided by way of example, as there are a variety of ways to carry out the method. Each block shown in FIG. 7 represents one or more processes, methods or subroutines, carried out in the exemplary method. The exemplary method can begin at block N1. At block N1, a transparent conductive layer is formed on a base. At block N2, a first metal layer is formed on the transparent conductive layer. At block N3, a first insulating layer is formed on the base, the transparent conductive layer, and the first metal layer. At block N4, a semiconductor layer is formed on the first insulating layer. At block N5, a pixel electrode layer is formed on the first insulating layer. At block N6, a second metal layer is formed on the first insulating layer. At block N7, a second insulating layer is formed is formed on the semiconductor layer, pixel electrode layer, the second metal layer, and the first insulating layer. At block N8, a hole is defined in the first insulating layer and the second insulating layer. At block N9, a common electrode layer is formed on the second insulating layer. Each forming process may be implemented according to the above-described process. In at least one embodiment, the forming of the transparent conductive layer and the forming of the first metal layer may be implemented in one process using a single mask.

Figure 8:
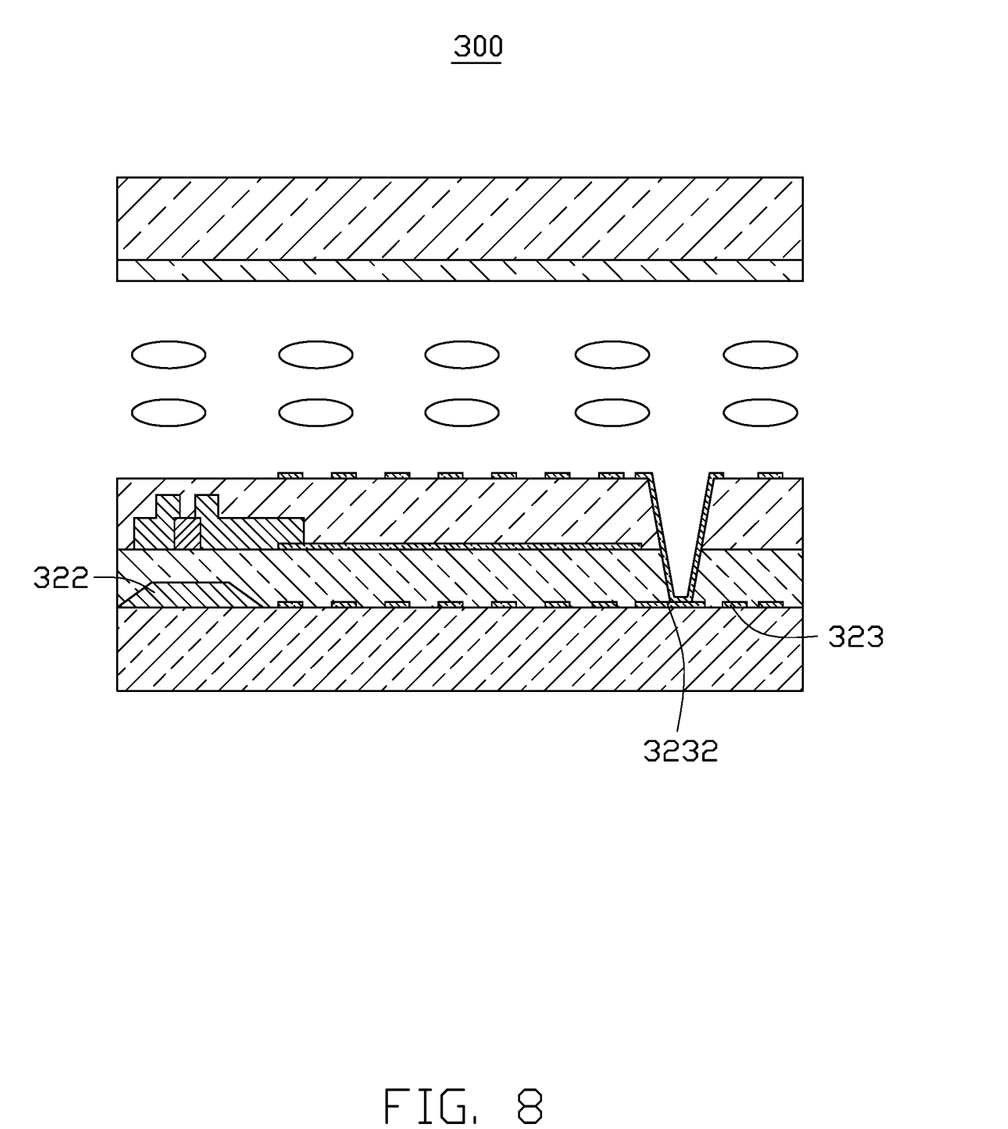
FIG. 8 is a cross-sectional view of a third exemplary embodiment of an LCD panel.
Figure 9:
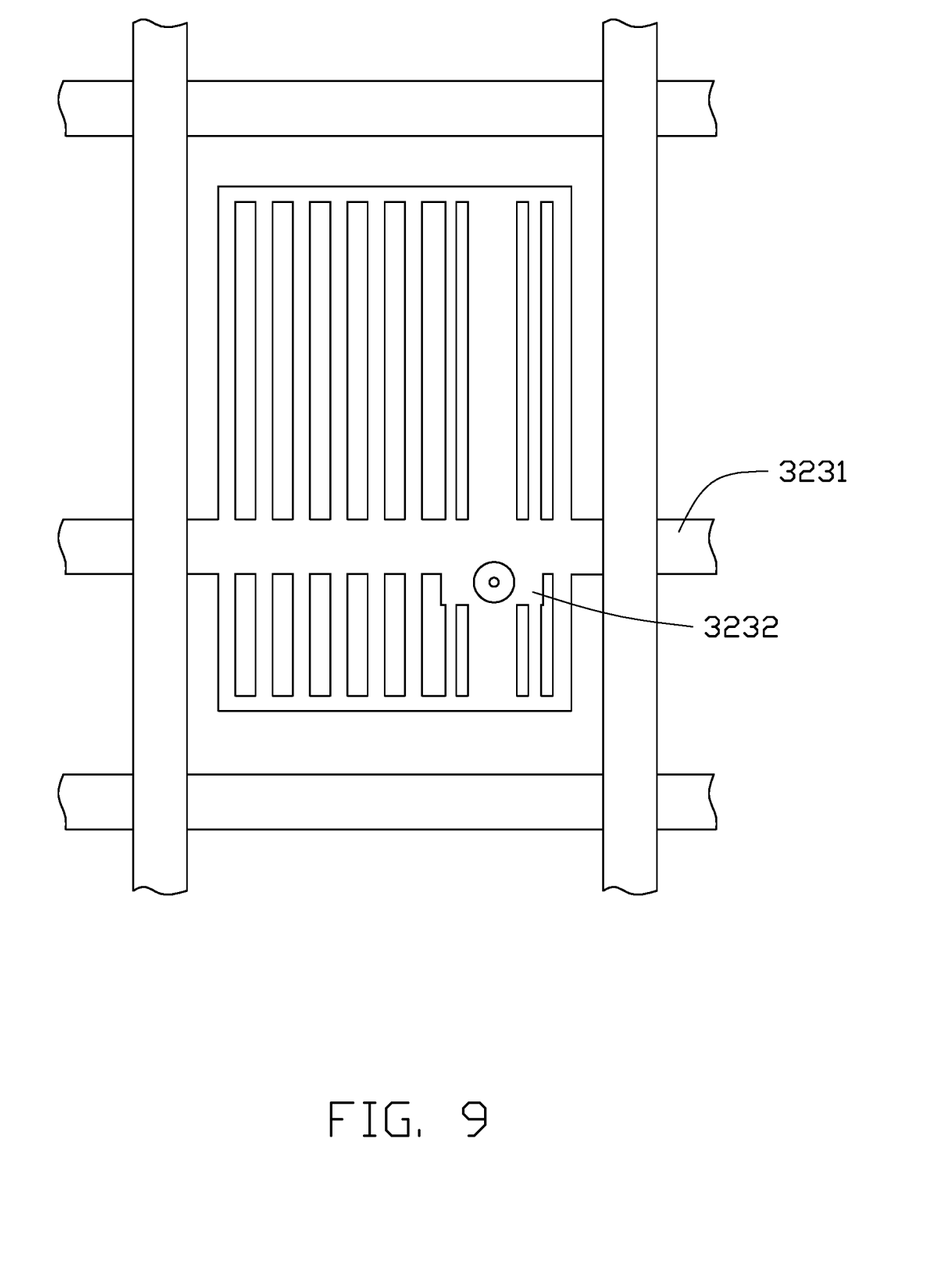
FIG. 9 is a plan view of a transparent conductive layer in the LCD panel of FIG. 8.

FIGS. 8 and 9 illustrate an LCD panel 300 according to a third exemplary embodiment. The LCD panel 300 is substantially the same as the LCD panel 100 except that the first metal layer 322 of the LCD panel 300 does not include a storage capacitor and a storage capacitor line. Further, the transparent conductive layer 323 of the LCD panel 300 includes an extending portion 3232 as a storage capacitor and at least one storage capacitor line 3231 electrically coupled to the extending portion 3232. The storage capacitor line 3231 is configured to electrically connect to an outside driving circuit to apply a common voltage to the extending portion 3232.

Figure 10:
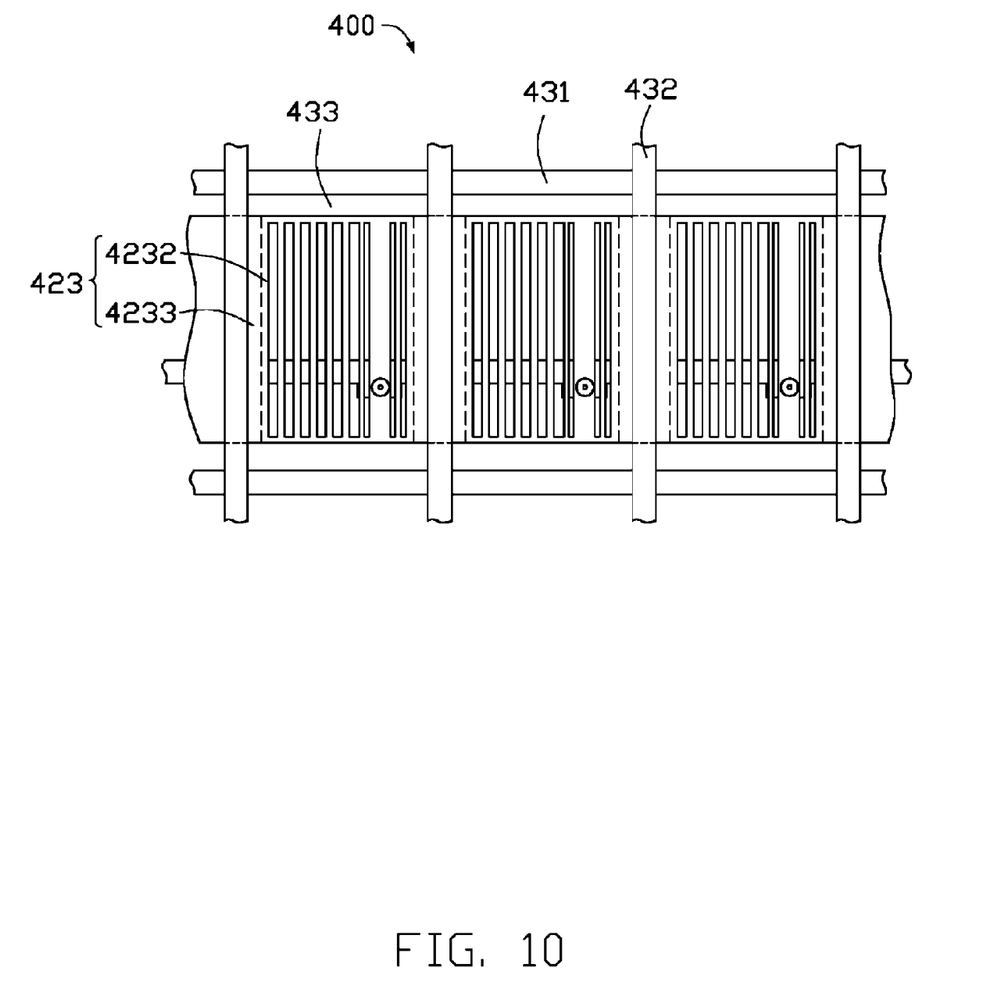
FIG. 10 is a plan view of a transparent conductive layer of a fourth exemplary embodiment of an LCD panel.

FIG. 10 illustrates an LCD panel 400 according to a fourth exemplary embodiment. The LCD panel 400 is substantially the same as the LCD panel 100 except that the transparent conductive layer 423 of the LCD panel 400 includes a first portion 4232 having the same structure as the common electrode layer 129 and two second portions 4233 coupled to opposite sides of the first portion 4232. In at least one embodiment, the second portions 4233 in two adjacent pixel areas 433 around one source line 432 are coupled. In other embodiment, the second portions 4233 in the pixel areas 433 which extend along a line parallel to the gate line 431 are coupled.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A thin film transistor array substrate comprising:
a base;
a first metal layer formed on the base and having a gate electrode;
a first insulating layer formed on and covering the base and the first metal layer;
a semiconductor layer formed on the first insulating layer and facing the gate electrode, the semiconductor layer being insulated from the gate electrode;
a second metal layer formed on the first insulating layer and comprising a source electrode and a drain electrode, the semiconductor layer being located between the source electrode and the drain electrode and coupled to the source electrode and the drain electrode, wherein a thin film transistor is provided by the source electrode, the drain electrode, the semiconductor layer, and the gate electrode;
a pixel electrode layer formed on the first insulating layer and electrically coupled to the source electrode or the drain electrode to allow the thin film transistor to receive a display driving signal;
a common electrode layer insulated from the pixel electrode and configured to receive a common voltage and cooperate with the pixel electrode layer to implement display; and
a transparent conductive layer formed on the base and being insulated from the pixel electrode, the transparent conductive layer and the common electrode layer located at different layers of the thin film transistor array substrate, the transparent conductive layer being configured as an auxiliary storage capacitor;
wherein the transparent conductive layer comprises a first portion and two second portions coupled to opposite sides of the first portion; and the first portion has a same pattern structure as the common electrode layer.

2. The thin film transistor array substrate of claim 1, further comprising a second insulating layer; the first insulating layer covers the transparent conductive layer; the second insulating layer is formed on and covers the first insulating layer, the second metal layer, the semiconductor layer, and the pixel electrode layer; and the common electrode layer is formed on the second insulating layer.

3. The thin film transistor array substrate of claim 2, wherein the thin film transistor array substrate defines a hole extending through the second insulating layer and the first insulating layer; the common electrode layer is electrically coupled to the transparent conductive layer by the hole.

4. The thin film transistor array substrate of claim 1, further comprising a plurality of gate lines and a plurality of source lines insulated from the plurality of gate lines; the plurality of gate lines and the plurality of source lines intersect to define a plurality of pixels areas; and two adjacent second portions in two adjacent pixel areas around one source line are coupled.

5. The thin film transistor array substrate of claim 1, wherein the transparent conductive layer is electrically coupled to the common electrode layer.

6. The thin film transistor array substrate of claim 1, wherein the first metal layer further comprises a storage capacitor electrically coupled to the transparent conductive layer.

7. The thin film transistor array substrate of claim 6, wherein a portion of the transparent conductive layer is formed on and partially covers the storage capacitor, and other portion of the transparent conductive layer is formed on and partially covers a surface of the base.

8. The thin film transistor array substrate of claim 6, wherein the transparent conductive layer is formed on and partially covers a surface of the base; and the first metal layer is formed on the transparent conductive layer.

9. The thin film transistor array substrate of claim 1, wherein the transparent conductive layer comprises an extending portion as the auxiliary storage capacitor and at least one storage capacitor line electrically coupled to the extending portion.

10. A liquid crystal display panel comprising:
a thin film transistor array substrate;
an opposite substrate; and
a liquid crystal layer between the thin film transistor array substrate and the opposite substrate;
the thin film transistor array substrate comprising:
a base;
a first metal layer formed on the base and having a gate electrode;
a first insulating layer formed on and covering the base and the first metal layer;
a semiconductor layer formed on the first insulating layer and facing the gate electrode, the semiconductor layer being insulated from the gate electrode;
a second metal layer formed on the first insulating layer and comprising a source electrode and a drain electrode, the semiconductor layer being located between the source electrode and the drain electrode and coupled to the source electrode and the drain electrode, wherein a thin film transistor is provided by the source electrode, the drain electrode, the semiconductor layer, and the gate electrode;
a pixel electrode layer formed on the first insulating layer and electrically coupled to the source electrode or the drain electrode to allow the thin film transistor to receive a display driving signal;
a common electrode layer insulated from the pixel electrode and configured to receive a common voltage and cooperate with the pixel electrode layer to implement display; and
a transparent conductive layer formed on the base and being insulated from the pixel electrode, the transparent conductive layer and the common electrode layer located at different layers of the thin film transistor array substrate, the transparent conductive layer being configured as an auxiliary storage capacitor;
wherein the transparent conductive layer comprises a first portion and two second portions coupled to opposite sides of the first portion; and the first portion has a same pattern structure as the common electrode layer.

11. The liquid crystal display panel of claim 10, wherein the thin film transistor array substrate further comprises a second insulating layer; the first insulating layer covers the transparent conductive layer; the second insulating layer is formed on and covers the first insulating layer, the second metal layer, the semiconductor layer, and the pixel electrode layer; and the common electrode layer is formed on the second insulating layer.

12. The liquid crystal display panel of claim 11, wherein the thin film transistor array substrate defines a hole extending through the second insulating layer and the first insulating layer; the common electrode layer is electrically coupled to the transparent conductive layer by the hole.

13. The liquid crystal display panel of claim 10, wherein the thin film transistor array substrate further comprises a plurality of gate lines, and a plurality of source lines insulated from the plurality of gate lines; the plurality of gate lines and the plurality of source lines are intersect to define a plurality of pixels areas; and two adjacent second portions in two adjacent pixel areas around one source line are coupled.

14. The liquid crystal display panel of claim 10, wherein the transparent conductive layer is electrically coupled to the common electrode layer.

15. The liquid crystal display panel of claim 10, wherein the first metal layer further comprises a storage capacitor electrically coupled to the transparent conductive layer.

16. The liquid crystal display panel of claim 15, wherein a portion of the transparent conductive layer is formed on and partially covers the storage capacitor, and other portion of the transparent conductive layer is formed on and partially covers a surface of the base.

17. The liquid crystal display panel of claim 15, wherein the transparent conductive layer is formed on and partially covers a surface of the base; and the first metal layer is formed on the transparent conductive layer.

18. The liquid crystal display panel of claim 10, wherein the transparent conductive layer comprises an extending portion as the auxiliary storage capacitor and at least one storage capacitor line electrically coupled to the extending portion.

19. A thin film transistor array substrate comprising:
a base;
a first metal layer formed on the base and having a gate electrode;
a first insulating layer formed on and covering the base and the first metal layer;
a semiconductor layer formed on the first insulating layer and facing the gate electrode, the semiconductor layer being insulated from the gate electrode;
a second metal layer formed on the first insulating layer and comprising a source electrode and a drain electrode, the semiconductor layer being located between the source electrode and the drain electrode and coupled to the source electrode and the drain electrode, wherein a thin film transistor is provided by the source electrode, the drain electrode, the semiconductor layer, and the gate electrode;
a pixel electrode layer formed on the first insulating layer and electrically coupled to the source electrode or the drain electrode to allow the thin film transistor to receive a display driving signal;
a common electrode layer insulated from the pixel electrode and configured to receive a common voltage and cooperate with the pixel electrode layer to implement display; and
a transparent conductive layer formed on the base and insulated from the pixel electrode, the transparent conductive layer and the common electrode layer located at different layers of the thin film transistor array substrate;

wherein the transparent conductive layer has a same pattern structure as the common electrode layer.

20. The thin film transistor array substrate of claim 19, further comprising a second insulating layer; wherein the transparent conductive layer is between the base and the first insulating layer; wherein the second insulating layer is formed on and covers the first insulating layer, the second metal layer, the semiconductor layer, and the pixel electrode layer; wherein the common electrode layer is formed on the second insulating layer; wherein the thin film transistor array substrate defines a hole extending through the second insulating layer and the first insulating layer; the common electrode layer is electrically coupled to the transparent conductive layer by the hole.

* * * * *